US008861285B2

(12) United States Patent
Choi

(10) Patent No.: US 8,861,285 B2
(45) Date of Patent: Oct. 14, 2014

(54) APPARATUSES AND METHODS FOR LINE CHARGE SHARING

(75) Inventor: Hoon Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 9 days.

(21) Appl. No.: 13/369,928

(22) Filed: Feb. 9, 2012

(65) Prior Publication Data
US 2013/0208547 A1 Aug. 15, 2013

(51) Int. Cl.
*G11C 7/10* (2006.01)

(52) U.S. Cl.
USPC ...................................... 365/189.05; 365/203

(58) Field of Classification Search
USPC ............................................ 365/189.05, 203
See application file for complete search history.

(56) References Cited

U.S. PATENT DOCUMENTS

| 5,745,423 | A | 4/1998 | Tai |
| 5,801,574 | A | 9/1998 | Martin et al. |
| 6,262,920 | B1 | 7/2001 | Louie et al. |
| 6,310,809 | B1 | 10/2001 | Roohparvar et al. |
| 6,356,115 | B1 | 3/2002 | Dabral et al. |
| 6,496,425 | B1 | 12/2002 | Abedifard et al. |
| 6,717,459 | B2 | 4/2004 | Blodgett |
| 6,738,300 | B2 | 5/2004 | Barth, Jr. |
| 6,778,455 | B2 | 8/2004 | Bell |
| 6,785,179 | B1 | 8/2004 | Bull et al. |
| 6,845,051 | B2 | 1/2005 | Komura |
| 7,394,701 | B2 | 7/2008 | Jung et al. |
| 7,679,948 | B2 | 3/2010 | Park et al. |
| 7,940,581 | B2 | 5/2011 | Arsovski et al. |
| 8,223,567 | B2 | 7/2012 | Abu et al. |
| 2003/0012047 | A1 | 1/2003 | Morgan |
| 2006/0262069 | A1* | 11/2006 | Do et al. .......................... 345/98 |
| 2007/0047324 | A1 | 3/2007 | Ha |
| 2008/0136806 | A1* | 6/2008 | Lee et al. ....................... 345/212 |
| 2009/0128533 | A1* | 5/2009 | Tsubata ......................... 345/209 |
| 2009/0147559 | A1 | 6/2009 | Lee et al. |
| 2010/0214833 | A1 | 8/2010 | Takemura et al. |
| 2011/0116322 | A1 | 5/2011 | Seol et al. |
| 2011/0128764 | A1 | 6/2011 | Hosoe et al. |
| 2011/0149662 | A1* | 6/2011 | Batra et al. ............... 365/189.16 |
| 2011/0205800 | A1 | 8/2011 | Roohparvar |
| 2012/0105494 | A1* | 5/2012 | Lee et al. ....................... 345/690 |
| 2012/0169783 | A1* | 7/2012 | Park .............................. 345/690 |
| 2012/0307580 | A1 | 12/2012 | Katoch et al. |
| 2013/0163358 | A1 | 6/2013 | Bringivijayaraghavan |
| 2013/0194877 | A1 | 8/2013 | Yang et al. |
| 2013/0258789 | A1 | 10/2013 | Takahashi |
| 2013/0286739 | A1 | 10/2013 | Roohparvar |
| 2014/0071777 | A1 | 3/2014 | Bringivijayaraghavan |

* cited by examiner

*Primary Examiner* — Michael Tran
(74) *Attorney, Agent, or Firm* — Dorsey & Whitney LLP

(57) ABSTRACT

Apparatuses and methods for charge sharing between signal lines are disclosed. An example apparatus may include first and second lines and a charge sharing circuit. The charge sharing circuit may be coupled to the first line and the second line and configured to receive a first data signal and a second data signal. The charge sharing circuit may be further configured to cause charge to be shared between the first line and the second line responsive, at least in part, to the first data signal and the second data signal having different logic levels.

31 Claims, 5 Drawing Sheets

US 8,861,285 B2

APPARATUSES AND METHODS FOR LINE CHARGE SHARING

TECHNICAL FIELD

Embodiments of this invention relate generally to memory, and more particularly, in one or more of the illustrated embodiments, to charge sharing between signal lines.

BACKGROUND OF THE INVENTION

In various memories, data signals may be provided between devices over lines (e.g. bit lines). In some cases, providing data signals in this manner includes precharging the lines to a certain logic level (e.g. logic high) and subsequently driving the lines with logic levels representative of data (e.g. input/write data, output/read data, address data, command data, etc.) to be provided to the lines. A logic high may be a voltage associated with a high supply voltage, such as VCC, and a logic low may be a voltage associated with a low supply voltage, such as ground.

Typically, one or more of the lines are precharged to a logic high. Some systems for example, may precharge all lines, whereas others may precharge one line in each of a plurality of complementary pairs of lines. Precharge operations consume power by driving the lines to a precharge voltage. Following a precharge operation, lines may be driven to respective logic levels representative of data by selectively maintaining the precharged logic level, or by changing the logic level. Consequently, charge (and as a result power) may be consumed. For example, if a line is precharged to a logic high, the charge required to precharge the line to a logic high will be wasted when the line is driven to a logic low. The charge on the line will be discharged by, for example, coupling the line to a low supply voltage to drive the line to the appropriate logic state.

Generally, the length of the line may determine the total capacitance of a line and, therefore, the charge needed to drive a line to a logic high. It follows that the longer a line, the more charge that may be consumed as a result of discharging charge in a conventional precharge operation.

Many devices today include memories having long lines and are operated at relatively fast, and steadily increasing, operating speeds. As a result, performance of these devices has improved. However, improvements in power consumption is desirable given that many of these memories are used in battery power devices, such as mobile devices.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
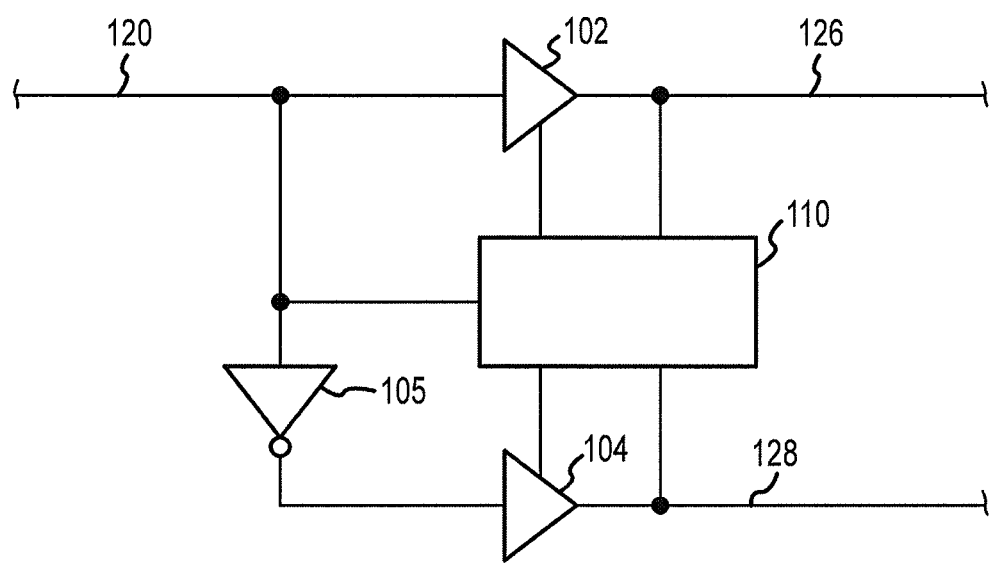
FIG. 1 is a schematic diagram of an apparatus according to an embodiment of the invention.

FIG. 1 illustrates an apparatus 100 according to an embodiment of the invention. The apparatus 100 includes a driver 102, a driver 104, and an inverter 105. The drivers 102, 104 may be conventional drivers as known in the art and will not be discussed in detail in the interest of brevity. Additionally, the inverter 105 may be a complementary metal oxide semiconductor ("CMOS") inverter, or may be other inverters known in the art, such as n-channel or p-channel MOS inverters. The driver 102 and the inverter 105 may each be coupled to a bus 120, and the driver 104 may be coupled to the inverter 105 such that the driver 104 is configured to receive the complement of data applied to bus 120. The drivers 102, 104 may also be coupled to lines 126, 128, respectively. Each line 126, 128 may be driven to a respective logic level by a respective driver 102, 104 responsive to data applied to the bus 120. The apparatus 100 may further include a charge sharing circuit 110. The charge sharing circuit 110 may be coupled to the bus 120 and the lines 126, 128. As will be explained in more detail below, the charge sharing circuit 110 may cause charge to be shared between lines, such as the lines 126, 128, based, at least in part, on a comparison of two or more data signals.

The lines 126, 128 may be configured to carry the data signals from one location to another and may have a resistance and a capacitance which may be distributed over the length of the line. In some embodiments, lines 126, 128 may be, for instance, data lines, and in particular, relatively long data lines. Moreover, in one embodiment, lines 126, 128 may be coupled to a memory array (not shown in FIG. 1) and may be configured to provide data signals to and/or from the memory array. A memory (not shown in FIG. 1) may include the memory array and lines 126, 128, and in one embodiment, may include a plurality of sets of lines 126, 128. The lines 126, 128 may also be complementary data lines such that the lines 126, 128 are configured to provide differential signals. For example, based on a logic level of data applied to the bus 120, one of the lines 126, 128 may be driven a logic high while the other of the lines 126, 128 is driven to a logic low. In general, the lines 126, 128 may be driven to any logic level and the logic level may be based, at least in part, on data applied to bus 120.

In preparation for driving the lines 126, 128 to logic levels for a first data (e.g., a first write data of a plurality of consecutive write data to be written to memory) applied to the bus 120, each line 126, 128 may be precharged by a precharge circuit to a precharge voltage (e.g., one-half the voltage of a high logic level). The lines 126, 128 are then driven by the respective driver 102, 104 to complementary logic levels based on the logic level of the first data. For data applied to the bus 120 after the first data, the charge sharing circuit 110 may be used to cause charge already present on one of the lines 126, 128 to be shared between the lines, and as a result, may reduce the voltage each of the lines 126, 128 need to be driven to be at their respective logic levels.

After the lines 126, 128 have been driven to respective logic levels (e.g., based on data applied to the bus 120), the charge sharing circuit 110 may be used in preparation for driving the lines 126, 128 to new logic levels (e.g., responsive to new data applied to the bus 120). In one embodiment, the charge sharing circuit 110 may cause charge to be shared between the two lines 126, 128 based at least in part on a comparison of two signals. For example, the charge sharing circuit 110 may cause charge to be shared between lines 126 and 128 based on comparing the logic levels to which the lines 126, 128 are driven for current data applied to the bus 120 with the logic levels to which the lines 126, 128 will be driven for new data applied to the bus 120. Once the charge sharing circuit has caused charge to be shared, the lines 126, 128 may be driven to logic levels corresponding to the new data.

In an operation according to an embodiment of the invention, the charge sharing circuit may cause charge to be shared between the lines 126, 128 where the logic levels of lines 126, 128 for a current data are to be driven to different logic levels for the new data. Conversely, the charge sharing circuit may not cause charge to be shared between the lines 126, 128 where the logic levels of lines 126, 128 for current data are to be driven to the same logic levels for the new data. In an example operation, assume the line 126 was driven to a logic high and the line 128 was driven to a logic low in response to current logic high data applied to the bus 120. In preparation for driving the lines 126, 128 to logic levels for new data applied to the bus 120, the charge sharing circuit compares one or both of the logic levels of the lines 126, 128 to the respective logic level that the lines 126, 128 are to be driven for the new data.

Where the lines 126, 128 are to be driven from logic high to logic low and from logic low to logic high, respectively (i.e., line 126 is driven to a different logic level for the new data and line 128 is driven to a different logic level for the new data), the charge sharing circuit 110 will cause the charge of line 126 (from the high logic level of the current data) to be shared between lines 126, 128. The charge of line 126 will decrease and the charge of line 128 will increase, thereby reducing the voltage line 126 will need to be driven to a logic low and reducing the voltage line 128 will need to be driven to a logic high. Once the charge sharing operation has completed, the lines 126, 128 may be driven. Where the lines 126, 128 are to be driven from logic low to logic high and from logic high to logic low, respectively (i.e., line 126 is driven to the same logic level for the new data and line 128 is driven to the same logic level for the new data), the charge sharing circuit 110 will not cause the charge of line 126 (from the high logic level of the current data) to be shared between lines 126, 128. Line 126 will retain charge and will be driven to logic high again, and line 128 will be driven to logic low again.

As illustrated by the previous example operation, where new data applied to the bus 120 causes the line 126 to be driven to a different logic level and the line 128 to be driven to a different logic level for current data and a charge sharing circuit 110 is used, the amount of charge needed to precharge one or more of the lines and drive the lines 126, 128 to the respective logic levels for the new data may be reduced as compared to embodiments in which a charge sharing circuit is not used. For example, in preparation for driving new data, charge sharing may cause the lines 126, 128 to have a same voltage. In one embodiment, for instance, charge sharing may cause each of the lines 126, 128 to have a voltage that is approximately one-half of a supply voltage, such as a supply voltage VCC, or the average of a supply voltage and a reference voltage, such as a reference voltage VSS. When one or more of the lines 126, 128 is subsequently to be driven to a high state, the one or more lines may be driven from VCC/2 to a logic high, rather than from a logic low to a logic high.

As previously discussed, the charge sharing circuit 110 may cause charge to be shared between the lines 126, 128 based, at least in part, on a comparison of two or more data signals, and the comparison may, for example, be used to determine whether a line driven to a logic high is to be driven to a logic low for new data. The charge sharing circuit 110 may compare current data (e.g., which may be indicative of the logic state of one or more of the lines 126, 128) to new data (e.g., which may be indicative of the logic state to which the one or more of the lines 126, 128 will be driven). In some embodiments, the current data may be represented by the logic levels of lines 126, 128, and/or provided by the drivers 102, 104, and the new data signal may be represented by the logic level of bus 120 or the input of drivers 102, 104.

If the comparison indicates that the current and new data have, for instance, a same logic level, the charge sharing circuit 110 may not cause charge to be shared between lines 126, 128. However, if the charge sharing circuit 110 determines that the current and new data have different logic levels, the charge sharing circuit 110 may cause charge to be shared between the lines 126, 128. In some embodiments, the charge sharing circuit 110 may compare signals to determine whether to cause charge to be shared between complimentary lines 126, 128.

Figure 2:
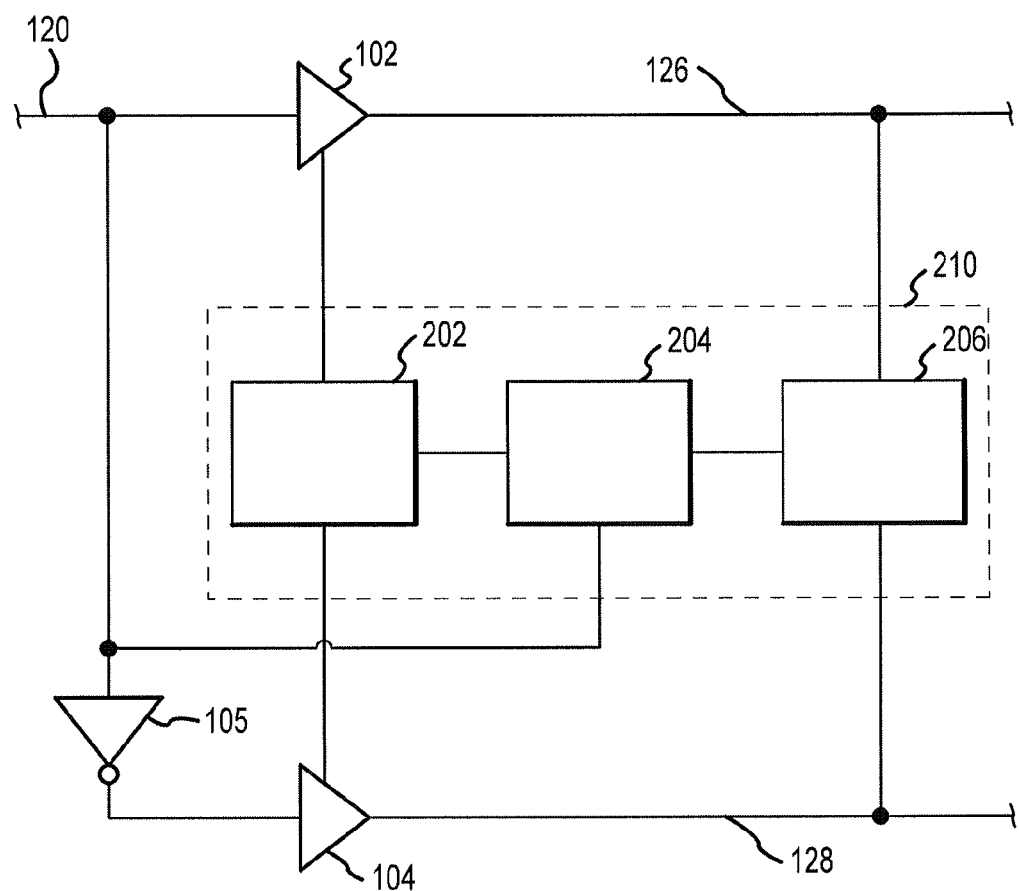
FIG. 2 is a block diagram of a charge sharing circuit that may be used in the apparatus of FIG. 1 according to an embodiment of the invention.

FIG. 2 illustrates an apparatus 200 having a charge sharing circuit 210 according to an embodiment of the invention. The charge sharing circuit 210 may be used as the charge sharing circuit 110 of FIG. 1. The apparatus 200 includes elements that have been previously described with respect to the apparatus 100 of FIG. 1. Those elements have been shown in FIG. 2 using the same reference numbers used in FIG. 1 and operation of the common elements is as previously described. Consequently, a detailed description of the operation of these elements will not be repeated in the interest of brevity.

The charge sharing circuit 210 includes a latch 202, a comparison circuit 204, and a switch circuit 206. The latch 202 may be coupled to drivers 102, 104, and the comparison circuit 204 may be coupled to the latch 202 and the bus 120. The switch circuit 206 is coupled to the lines 126, 128 and the comparison circuit 204. The comparison circuit 204 causes the switch circuit 206 to be closed to share charge between lines 126, 128 or to be open to not share charge between lines 126, 128. In an example operation, the latch 202 is provided current data by the drivers 102, 104 and latches the logic levels to which the lines 126, 128 are driven for the current data. As discussed above, new data may be provided to the comparison circuit 204 from the bus 120, or may be provided at the input of the drivers 102, 104. The comparison circuit 204 compares the latched logic levels of the current data with the logic levels of the new data applied to the bus 120. If the comparison circuit 204 determines that the current and new data, for instance, causes line 126 to be driven to the same logic level and/or causes line 128 to be driven to the same logic level, the comparison circuit 204 causes the switch circuit 206 to be open to not share charge between lines 126, 128. However, if the current and new data causes line 126 to be driven to a different logic level and/or causes line 128 to be driven to a different logic level, the comparison circuit 204 may cause the switch circuit 206 to be closed to share charge between lines 126, 128.

Figure 3:
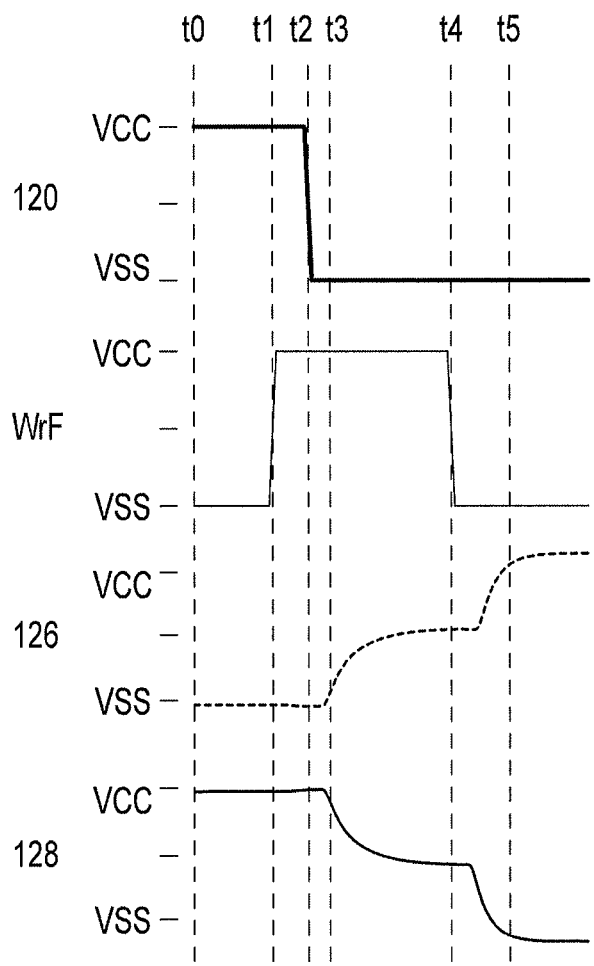
FIG. 3 illustrates a timing diagram of an operation of the apparatus of FIG. 1 according to an embodiment of the invention.

With reference to FIGS. 1 and 2, FIG. 3 illustrates a timing diagram of an operation of the apparatus 100 according to an embodiment of the invention. At a time t0, lines 126 and 128 may be, for example, at logic levels logic low and logic high, respectively. Moreover, data currently applied to bus 120 may be at a logic high and a control signal WrF may be at a logic low. The WrF signal may be generated by control logic (not shown) and may be indicative of times in which lines 126, 128 may be driven. For example, in at least one embodiment, such as the embodiment described with respect to FIG. 3, when WrF is at a logic low, the lines 126, 128 may be driven to respective logic states, and when WrF is at a logic high, the lines 126, 128 may not be driven.

At a time t1, the control signal WrF may transition to a logic high. At a time t2, new data may be applied the bus 120, and the charge sharing unit 110 may compare the new data (e.g. data applied to bus 120) to the current data (e.g. data indicative of the logic state of one or more of the line 126). As illustrated in FIG. 3, the current data and new data comprise different logic levels. Accordingly, at a time t3, the charge sharing unit 110 may share charge between the lines 126, 128 causing, for example, the charge of line 126 to increase and the charge of line 128 to decrease. Sharing charge between the lines 126, 128, for instance, may cause the each line 126, 128 to have a same voltage, such as VCC/2. After charge sharing has completed, at a time t4, the WrF control signal may transition to a logic low, and lines 126, 128 may be driven to logic levels different than the logic levels of lines 126, 128 at the time t5. In one embodiment, lines 126, 128 may be driven based, at least in part, on the WrF control signal having a particular logic level, such as logic low. As a result, charge may be shared at times when lines 126, 128 are not being driven.

Figure 4:
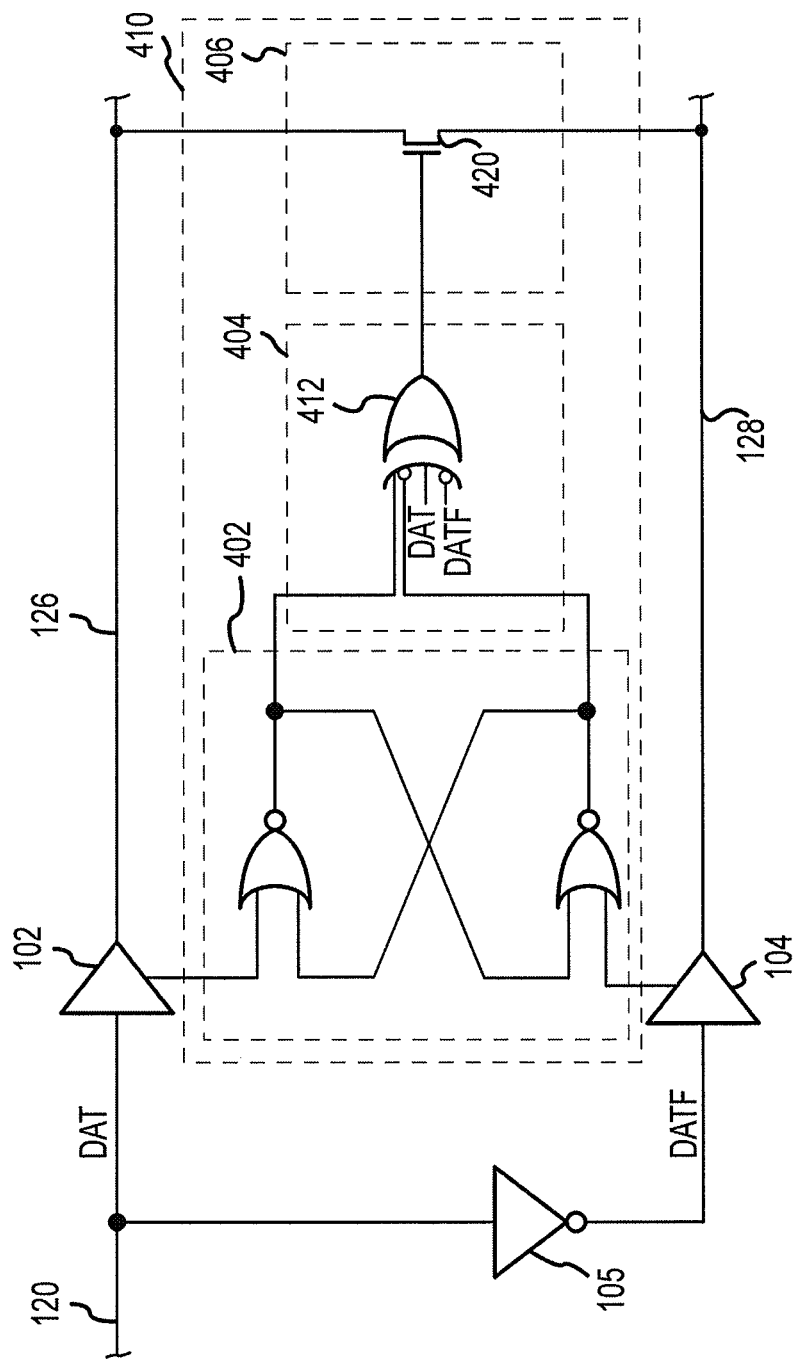
FIG. 4 is a schematic diagram of an apparatus according to an embodiment of the invention.

FIG. 4 illustrates an apparatus 400 having a charge sharing circuit 410 according to an embodiment of the invention. The charge sharing circuit 410 may be used for the charge sharing circuit 100 of FIG. 1 or the charge sharing circuit 200 of FIG. 2. The apparatus 400 may include elements that have been previously described with respect to the apparatus 100 of FIG. 1. Those elements have been shown in FIG. 4 using the same reference numbers used in FIG. 1 and operation of the common elements is as previously described. Consequently, a detailed description of the operation of these elements will not be repeated in the interest of brevity.

The charge sharing circuit 410 includes a latch 402, a comparison circuit 404, and a switch circuit 406. The latch 402 may, for example, be a conventional NOR latch as illustrated in FIG. 4, or may be other latches known by those having ordinary skill in the art, for example, NAND latches, D latches, or flip-flops (e.g. RS flip-flops, JK flip-flops, or D flip-flops). It will be appreciated by those having ordinary skill in the art that other implementations may be used without departing from the scope of the invention. The comparison circuit 404 may include comparison logic 412, and the switch circuit 406 may include a switch 420. The switch 420 may be a transistor (e.g. field effect transistor or bipolar junction transistor), such as an n-channel transistor, and configured to couple the line 126 to the line 128 responsive, at least in part, to receipt of a control signal from the comparison logic 412.

As illustrated in FIG. 4, the comparison logic 412 of the comparison circuit 404 is coupled to the latch 402 and is configured to receive complementary signals DAT and DATF representative of new data applied to the bus 120. In one embodiment, the comparison logic 412 is represented by an XOR logic gate. In some embodiments, the comparison logic 412 and/or the switch 420 may comprise any number or type of logic gates, control logic, and/or switches as known in the art. It will be appreciated by those having skill in the art that other implementations may be made without departing from the scope of the invention.

In an example operation, the lines 126, 128 may be driven to respective logic levels by the drivers 102, 104 based on the logic level of current data. The latch 402 may also receive the current data, or data signals representative of the current data. As illustrated in the embodiment of FIG. 4, the drivers 102, 104 provide data signals representative of the current data signal to the latch 402. Responsive, at least in part, to receipt of the data signals from the drivers 102, 104, the latch 402 may latch the data signals and thereby provide latched data signals to the comparison logic 412 of the comparison circuit 404. The comparison logic 412 further receives new data applied to the bus 120, or data signals representative of the new data (e.g., the DAT and DATF signals), and compares the data signals for the current data and the new data as described above. The comparison logic 412 may receive the DATF signal from the inverter 105 or may receive the DATF signal from other logic. The comparison logic 412 may provide a control signal based, at least in part, on the comparison of the data signals for the current data and the new data to control the switch 420 of the switch circuit 406. The comparison logic 412 may cause the switch 420 to be closed, thereby causing charge to be shared between the lines 126, 128, or to be open, thereby not causing charge to be shared between the lines 126, 128.

Figure 5:
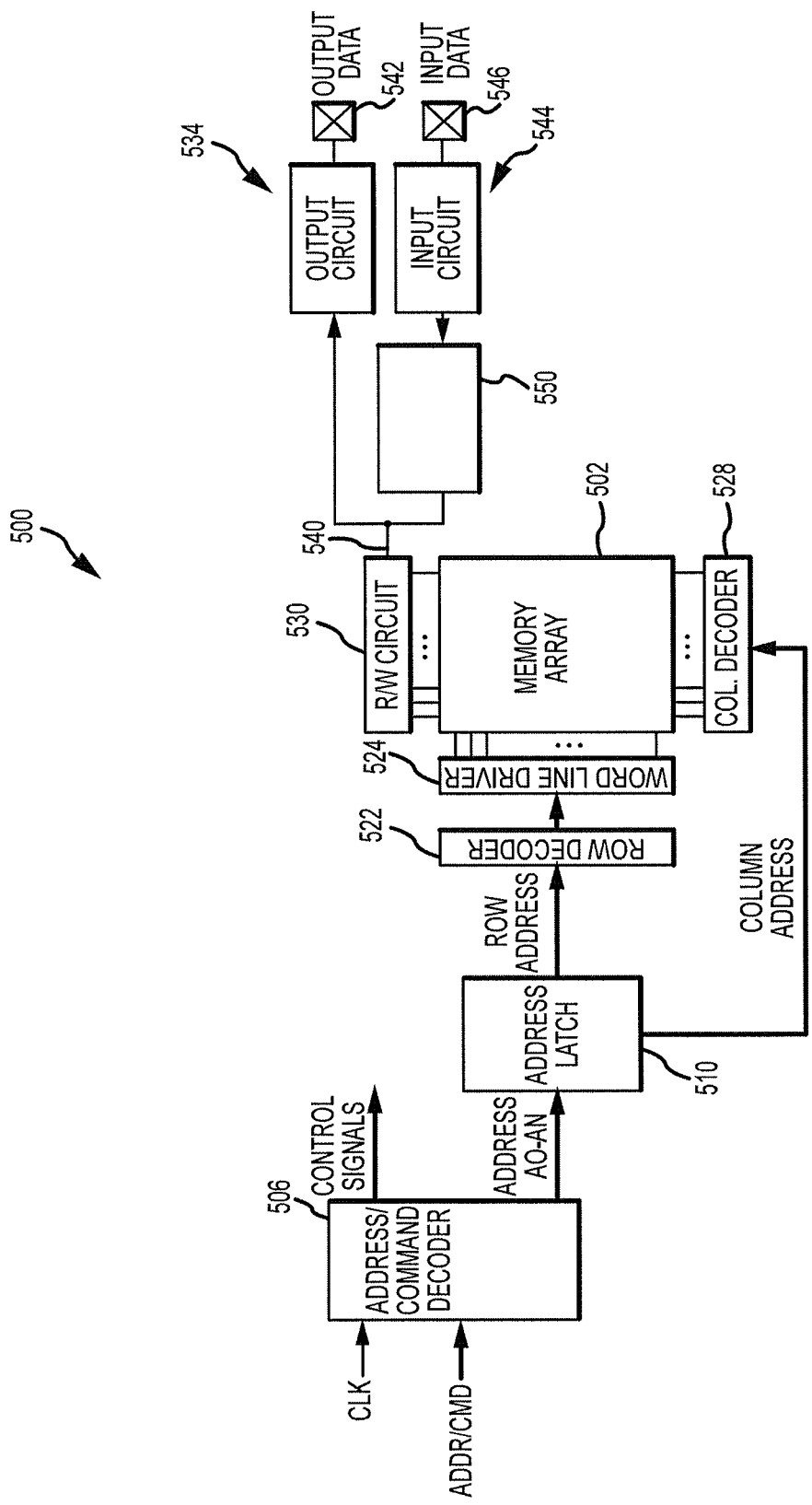
FIG. 5 is a block diagram of a memory according to an embodiment of the present invention.

FIG. 5 illustrates a portion of a memory 500 according to an embodiment of the present invention. The memory 500 includes an array 502 of memory cells, which may be, for example, DRAM memory cells, SRAM memory cells, flash memory cells, or some other types of memory cells. The memory 500 includes an address/command decoder 506 that receives memory commands and addresses through an ADDR/CMD bus. The address/command decoder 506 generates control signals, based on the commands received through the ADDR/CMD bus. The address/command decoder 506 also provides row and column addresses to the memory 500 through an address bus and an address latch 510. The address latch then outputs separate column addresses and separate row addresses.

The row and column addresses are provided by the address latch 510 to a row address decoder 522 and a column address decoder 528, respectively. The column address decoder 528 selects lines extending through the array 502 corresponding to respective column addresses. The row address decoder 522 is connected to word line driver 524 that activates respective rows of memory cells in the array 502 corresponding to received row addresses. The selected line (e.g., a bit line or bit lines) corresponding to a received column address are coupled to a read/write circuitry 530 to provide read data to a data output circuit 534 via an input-output data bus 540. An output pad 542 coupled to the data output circuit 534 is used for electrically coupling to the memory 500. Write data are provided to the memory array 502 through a data input circuit 544 and the memory array read/write circuitry 530. An input pad 546 coupled to the data input circuit 542 is used for electrically coupling to the memory 500.

At least a portion of the input-output data bus 540 may include an apparatus 550, which may be similar to any of the apparatuses 100, 200 or 500 described above, and may include one or more charge sharing circuits. In addition to or in place of the apparatus 550 on the input-output data bus 540, an apparatus may also be included in the read/write circuitry 530, in between the memory array 502 and the read/write circuitry 530, or in any other location in the memory 500.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:
1. An apparatus, comprising:
   first and second lines; and a charge sharing circuit coupled to the first and second lines, the charge sharing circuit configured to receive first and second data signals, the charge sharing circuit further configured to cause charge to be shared between the first and second lines responsive, at least in part, to determining the first and second data signals have different logic levels, the charge sharing circuit further configured to not cause charge to be shared between the first and second lines responsive, at least in part, to determining the first and second data signals have a same logic level.

2. The apparatus of claim 1, wherein the first data signal is indicative of data driven to the first line and the second data signal is indicative of data to be driven to the first line.

3. The apparatus of claim 1, wherein the charge sharing circuit is further configured to latch the first signal responsive, at least in part, to receipt of the first signal.

4. The apparatus of claim 1, further comprising:
first and second drivers, wherein the first and second drivers are configured to drive the first and second lines to respective logic levels based, at least in part, on receipt of the first data signal.

5. The apparatus of claim 1, further comprising a precharge circuit coupled to the first and second lines, and configured to precharge the first and second lines to a precharge voltage.

6. The apparatus of claim 1, wherein the charge sharing circuit is further configured to cause the first and second lines to have a same voltage responsive, at least in part, to causing charge to be shared.

7. An apparatus, comprising:
first and second lines; and
a charge sharing circuit, wherein the charge sharing circuit comprises:
 a latch configured to latch a first signal;
 a switch circuit coupled to the first and second lines; and
 a comparison circuit coupled to the latch and the first and second data lines, the comparison circuit configured to receive the latched first signal from the latch and a second signal, the comparison circuit configured to cause charge to be shared between the first and second lines responsive, at least in part, to the latched first signal and the second signal having different logic levels.

8. The apparatus of claim 7, wherein the first and second lines are complimentary data lines.

9. The apparatus of claim 7, wherein the comparison circuit comprises XOR logic configured to receive the latched first signal and the second signal.

10. The apparatus of claim 7, wherein the comparison circuit is configured to cause charge to be shared between the first and second lines by controlling the switch circuit to be closed.

11. The apparatus of claim 10, wherein the switch circuit comprises an n-channel transistor.

12. The apparatus of claim 7, further comprising first and second drivers coupled to the first and second lines, respectively, wherein the latch is configured to receive the first signal from at least one of the first and second drivers.

13. The apparatus of claim 12, wherein the first and second drivers are configured to provide respective data signals to the latch.

14. The apparatus of claim 7, wherein the first signal is representative of current data driven on the first and second lines and the second signal is representative of data to be driven on the first and second lines.

15. The apparatus of claim 7, wherein the first and second lines are configured to have a same voltage based, at least in part, on charge being shared between the first and second lines.

16. A method, comprising:
receiving a first data signal;
receiving a second data signal;
determining whether the first signal has a different logic level than the second signal; and
causing charge to be shared between a first line and a second line responsive, at least in part, to determining that the first signal has a different logic level than the second signal,
wherein receiving a first signal comprises:
 receiving the first signal at a latch;
 latching the first signal; and
 providing the latched first signal to comparison logic.

17. The method of claim 16, wherein said causing charge to be shared between a first line and a second line, comprises:
coupling the first line to the second line; and
causing the first line and the second line to have a same voltage.

18. The method of claim 17, further comprising:
precharging at least one of the first line or the second line to a precharge voltage.

19. The method of claim 16, further comprising:
causing charge not to be shared between the first line and the second line responsive, at least in part, to determining that the first signal has a same logic level as the second signal.

20. A method, comprising:
causing charge to be shared between a plurality of lines responsive, at least in part, to determining that logic levels driven on each of the lines for current data will be different on each of the lines for data,
wherein determining that logic levels driven on each of the lines for current data will be different on each of the lines for data comprises:
 determining that a first line of the plurality that is driven to a first logic level for the current data will transition to a second logic level for the data; and
 determining that a second line of the plurality that is driven to the second logic level for the current data will transition to the first logic level for the data.

21. The method of claim 20, wherein the first logic level has a voltage provided by a supply voltage and the second logic level has a voltage provided by a reference voltage.

22. The method of claim 20, further comprising:
writing a plurality of write data consecutively to a memory; and
driving the plurality of lines according to the plurality of write data.

23. An apparatus, comprising:
first and second lines;
a charge sharing circuit coupled to the first and second lines, the charge sharing circuit configured to receive first and second data signals and to latch the first data signal, the charge sharing circuit further configured to compare the latched first data signal to the second data signal to determine whether the latched first data signal and the second data signal have different logic levels, the charge sharing circuit further configured to cause charge to be shared between the first and second lines responsive, at least in part, to determining the first and second data signals have different logic levels; and a precharge circuit coupled to the first and second lines, and configured to precharge the first and second lines to a precharge voltage.

24. An apparatus, comprising:

first and second lines; and a charge sharing circuit coupled to the first and second lines, the charge sharing circuit configured to receive first and second data signals and to latch the first data signal, the charge sharing circuit further configured to compare the latched first data signal to the second data signal to determine whether the latched first data signal and the second data signal have different logic levels, the charge sharing circuit further configured to cause charge to be shared between the first and second lines responsive, at least in part, to determining the first and second data signals have different logic levels; and wherein the charge sharing circuit is further configured to not share charge between the first and second lines responsive, at least in part, to determining the first and second signals have a same logic level.

25. An apparatus, comprising:

first and second lines; and a charge sharing circuit coupled to the first and second lines, the charge sharing circuit configured to receive first and second data signals and to latch the first data signal, the charge sharing circuit further configured to compare the latched first data signal to the second data signal to determine whether the latched first data signal and the second data signal have different logic levels, the charge sharing circuit further configured to cause charge to be shared between the first and second lines responsive, at least in part, to determining the first and second data signals have different logic levels.

26. A method, comprising:

receiving a first data signal;

receiving a second data signal;

determining whether the first signal has a different logic level than the second signal;

causing charge to be shared between a first line and a second line responsive, at least in part, to determining that the first signal has a different logic level than the second signal; and causing charge not to be shared between the first line and the second line responsive, at least in part, to determining that the first signal has a same logic level as the second signal.

27. A method, comprising:

comparing logic levels of current data driven on a plurality of lines to logic levels of new data to be driven on the plurality of lines to determine whether the logic levels of the current data is different than the logic levels of the new data;

causing charge to be shared between the plurality of lines responsive, at least in part, to determining that the logic levels of the current data will be different on each of the lines for new data;

writing a plurality of write data consecutively to a memory; and driving the plurality of lines according to the plurality of write data.

28. The apparatus of claim 1, wherein at least one of the first signal or the second signal comprise write data and wherein the first and second lines are complimentary data lines.

29. The apparatus of claim 23, wherein the first and second lines are complimentary data lines.

30. The apparatus of claim 24, wherein the first and second lines are complimentary data lines.

31. The method of claim 27, wherein the first and second lines are complimentary data lines.

* * * * *